United States Patent
Srivastava et al.

(10) Patent No.: US 12,211,736 B2
(45) Date of Patent: Jan. 28, 2025

(54) FLOWABLE CHEMICAL VAPOR DEPOSITION OF METAL OXIDES

(71) Applicant: Applied Materials, Inc., Santa Clara, CA (US)

(72) Inventors: Hurshvardhan Srivastava, Milpitas, CA (US); Keith T. Wong, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 580 days.

(21) Appl. No.: 17/515,773

(22) Filed: Nov. 1, 2021

(65) Prior Publication Data

US 2022/0139765 A1 May 5, 2022

Related U.S. Application Data

(60) Provisional application No. 63/109,157, filed on Nov. 3, 2020.

(51) Int. Cl.
*H01L 21/762* (2006.01)
*C23C 16/40* (2006.01)
*H01L 21/02* (2006.01)
*H01J 37/32* (2006.01)

(52) U.S. Cl.
CPC ...... *H01L 21/76224* (2013.01); *C23C 16/403* (2013.01); *C23C 16/407* (2013.01); *H01L 21/02175* (2013.01); *H01L 21/02178* (2013.01); *H01L 21/02181* (2013.01); *H01L 21/02205* (2013.01); *H01L 21/02274* (2013.01); *H01J 37/3244* (2013.01); *H01J 2237/3321* (2013.01)

(58) Field of Classification Search
None
See application file for complete search history.

(56) References Cited

U.S. PATENT DOCUMENTS

2016/0276148 A1* 9/2016 Qian ............... H01L 21/02164

* cited by examiner

*Primary Examiner* — Asok K Sarkar
(74) *Attorney, Agent, or Firm* — Kilpatrick Townsend & Stockton LLP

(57) ABSTRACT

Exemplary deposition methods may include introducing a vapor of a metal alkoxide into a processing volume of a semiconductor processing chamber. A substrate defining a trench may be housed in the processing volume. The methods may include condensing the vapor into a liquid metal alkoxide within the trench on the substrate. The methods may include forming a plasma external to the processing volume of the semiconductor processing chamber. The methods may include introducing plasma-generated species into the processing volume. The methods may include exposing the liquid metal alkoxide in the trench to the plasma-generated species. The methods may also include forming a metal oxide film in the trench through a reaction between the liquid metal alkoxide and the plasma-generated species.

20 Claims, 4 Drawing Sheets

FLOWABLE CHEMICAL VAPOR DEPOSITION OF METAL OXIDES

CROSS-REFERENCE TO RELATED APPLICATIONS

This application claims the benefit of, and priority to U.S. Provisional Application Ser. No. 63/109,157, filed Nov. 3, 2020, which is hereby incorporated by reference in its entirety for all purposes.

TECHNICAL FIELD

The present technology relates to semiconductor processes and chamber components. More specifically, the present technology relates to modified components and deposition methods.

BACKGROUND

Integrated circuits are made possible by processes which produce intricately patterned material layers on substrate surfaces. Producing patterned material on a substrate requires controlled methods of formation and removal of exposed material. As device sizes continue to shrink, trenches may approach a characteristic dimension or aspect ratio smaller than which typical deposition processes may bridge over the trenches. During deposition methods, chemical vapor deposition processes may deposit metal oxide or metal nitride films overlying the trenches without filling the trenches, which may affect device quality.

Thus, there is a need for improved systems and methods that can be used to produce high quality devices and structures. These and other needs are addressed by the present technology.

SUMMARY

Exemplary deposition methods may include introducing a vapor of a metal alkoxide into a processing volume of a semiconductor processing chamber. A substrate defining a trench may be housed in the processing volume. The methods may include condensing the vapor into a liquid metal alkoxide within the trench on the substrate. The methods may include forming a plasma external to the processing volume of the semiconductor processing chamber. The methods may include introducing plasma-generated species into the processing volume. The methods may include exposing the liquid metal alkoxide in the trench to the plasma-generated species. The methods may also include forming a metal oxide film in the trench through a reaction between the liquid metal alkoxide and the plasma-generated species.

In some embodiments, the deposition methods may further include generating the vapor of the metal alkoxide by heating an ampoule of a liquid comprising the metal alkoxide above a boiling point of the metal alkoxide at a process pressure. The semiconductor processing chamber may include a pedestal. The semiconductor processing chamber may be maintained at a process pressure. The semiconductor processing chamber may be maintained at a first temperature equal to or greater than a boiling point of the metal alkoxide at the process pressure. The pedestal may be individually maintained at a second temperature less than the boiling point of the metal alkoxide at the process pressure. The vapor of the metal alkoxide may be or include hafnium tert butoxide, the process pressure may be at or about 1 torr, the first temperature may be greater than or about 50° C., and the second temperature may be less than or about 70° C. The vapor of the metal alkoxide may be or include tin tert butoxide, the process pressure may be at or about 1 torr, the first temperature may be greater than or about 80° C., and the second temperature may be less than or about 90° C. The vapor of the metal alkoxide may be or include aluminium iso propoxide, the process pressure may be at or about 1 torr, the first temperature may be greater than or about 90° C., and the second temperature may be less than or about 100° C. The plasma generated species may be or include monatomic oxygen radicals. Introducing the plasma generates species into the processing volume may include providing the monatomic oxygen radicals to the trench. The reaction may be or include radical-mediated removal of organic substituents of the metal alkoxide.

Some embodiments of the present technology may encompass deposition methods. The methods may include forming a plasma external to a processing volume of a semiconductor processing chamber. A substrate defining a trench may be housed in the processing volume. The methods may include introducing plasma-generated species into the processing volume. The methods may include introducing a vapor of a metal alkoxide into the processing volume concurrently with the introduction of the plasma-generated species. The methods may include generating metal oxide reaction products through a reaction between the vapor of the metal alkoxide and the plasma-generated species. The methods may include condensing the metal oxide reaction products onto the substrate. The methods may also include forming a metal oxide film in the trench. The metal oxide film may be or include the metal oxide reaction products.

In some embodiments, the deposition methods may further include generating the vapor of the metal alkoxide by heating an ampoule of a liquid including the metal alkoxide above a boiling point of the metal alkoxide at a process pressure. The metal oxide film may fill the trench. The vapor of the metal alkoxide may be or include hafnium tert butoxide, the process pressure may be at or about 5 torr, the first temperature may be greater than or about 80° C., and the second temperature may be less than or about 100° C. The vapor of the metal alkoxide may be or include tin tert butoxide, the process pressure may be at or about 5 torr, the first temperature may be greater than or about 115° C., and the second temperature may be less than or about 130° C. The vapor of the metal alkoxide may be or include aluminium iso propoxide, the process pressure may be at or about 1 torr, the first temperature may be greater than or about 90° C., and the second temperature may be less than or about 100° C.

Some embodiments of the present technology may encompass deposition methods. The methods may include evaporating a metal alkoxide liquid from an ampoule at a first temperature and a process pressure. The evaporation may generate a vapor of the metal alkoxide from the metal alkoxide liquid. The methods may include introducing the vapor of the metal alkoxide into a semiconductor processing chamber via a first plurality of channels of a dual-source gas distributor. The methods may include forming a plasma external to a processing volume of the semiconductor processing chamber. A substrate defining a trench may be housed in the processing volume. The methods may include introducing plasma-generated radicals into the processing volume via a second plurality of channels of the dual-source gas distributor, wherein the first plurality of channels is isolated from the second plurality of channels. The methods may include condensing the vapor of the metal alkoxide onto the substrate. The condensing may form a liquid metal alkoxide within the trench. The methods may include exposing the liquid metal alkoxide within the trench to the plasma-generated radicals. The methods may also include forming a metal oxide film within the trench through a reaction with the plasma-generated radicals.

In some embodiments, introducing the plasma-generated radicals may follow the condensing the vapor of the metal alkoxide onto the substrate. The plasma-generated radicals may be or include at least one of monatomic oxygen radicals or monatomic hydrogen radicals. The plasma may be formed from a gas including hydrogen and oxygen. The metal alkoxide liquid may be or include at least one of aluminium iso propoxide, tin tert butoxide, or hafnium tert butoxide.

Such technology may provide numerous benefits over conventional systems and techniques. For example, the systems may provide a flowable CVD process for forming metal oxide films within high aspect ratio trenches. In this way, the operations of embodiments of the present technology may produce improved CMOS processes, which may facilitate the fabrication of smaller semiconductor features. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
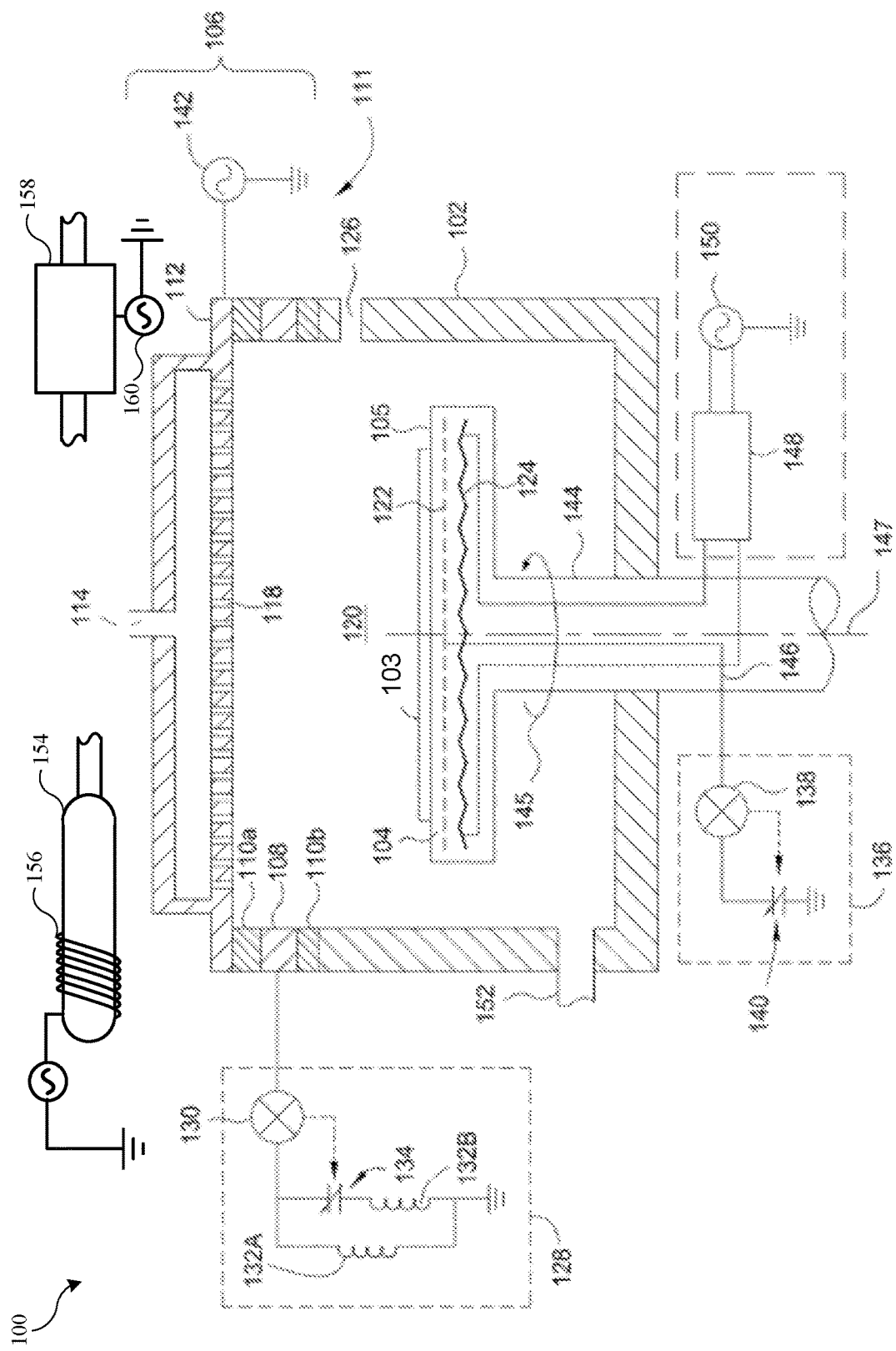
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During material deposition, such as of metal oxide or other oxide materials, plasma enhanced deposition may produce a local plasma between a showerhead or gas distributor and a substrate support. As precursors are activated in the plasma, the deposition materials may form and deposit on the substrate. Where the substrate defines recessed features, such as trenches or gaps, the deposition materials thus generated may deposit on the substrate as a conformal coating that bridges over the recessed features. In such cases, the conformal coating may leave the recessed features unfilled, limiting the effectiveness of coating processes to fabricate gap-fill structures.

Conventional technology has approached this limitation through process integration techniques, such as control of plasma parameters or flow control techniques. The present technology may overcome these limitations by implementing flowable chemical vapor deposition (FCVD) processes to condense liquid precursors into recessed features of a substrate. For example, a volatile metal oxide precursor may be provided into a semiconductor processing chamber as a vapor, such that it may condense onto a substrate defining recessed features. Concurrent or subsequent the provision of the vapor precursor, a remote plasma may be generated using a remote plasma source, such that plasma generated species may be provided to a processing volume of the semiconductor processing chamber via a showerhead or gas distributor. This may cause a metal oxide film to be formed within the recessed features, which may enable fabrication operations as part of a CMOS process on substrates defining recessed features of a characteristic dimension below that where conventional technology will form a conformal coating, rather than filling the recessed features. After describing general aspects of a chamber according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

The chamber 100 may include components enabling flowable CVD (FCVD) deposition methods. To that end, in addition to the capability to introduce process gasses through the inlet 114 from gas sources, such as compressed cylinders, the chamber 100 may include a vapor source 154. The vapor source 154 may be or include a holder or retaining element receiving an ampoule of a liquid or solid precursor, as described below. The chamber 100 may provide a vapor 357 of the precursor by vaporizing or sublimating the precursor, for example, by heating the precursor above the phase transition temperature at the process pressure, using, for example, a resistive heater 156. Through gas handling, for example, by aspiration or by saturating an inert carrier gas, a vapor of the precursor may be provided into the process region 120 via the gas distributor 112. To prevent the vapor of the precursor from re-condensing on surfaces of the gas distributor 112 and the chamber body 102, the chamber lid 106 and the chamber body 102 may incorporate heating circuits, similar to those described in reference to the substrate support 104. In this way, the gas distributor 112 and the chamber body may be maintained at a temperature above the phase transition temperature of the precursor at the process pressure, and condensation of the precursor may be substantially limited to the substrate 103.

Furthermore, in addition to systems for forming a plasma in the processing volume 120, the chamber 100 may include a remote plasma source 158. The remote plasma source 158 may include, but is not limited to, an inductively coupled plasma source, a capacatively coupled plasma source, a surface wave microwave source, or other plasma power source 160 selected to provide plasma generated species with a characteristic species density of radicals or metastable species. Whereas plasma sources may generate radicals as well as other, more energetic, species, the other plasma generated species may exhibit excessive reactivity or short lifetime. As such, the remote plasma source 158 may provide the capability to introduce plasma generated species, such as radical species, into the processing volume 120, while limiting exposure of the substrate 103 to damaging plasma generated species. As described in more detail in reference to FIG. 3C, the gas distributor 112 may include two isolated sets of channels, such as apertures 118, through which the vapor of the precursor and the plasma generated species may be provided to the processing volume 120 without interacting prior to the introduction.

Figure 2:
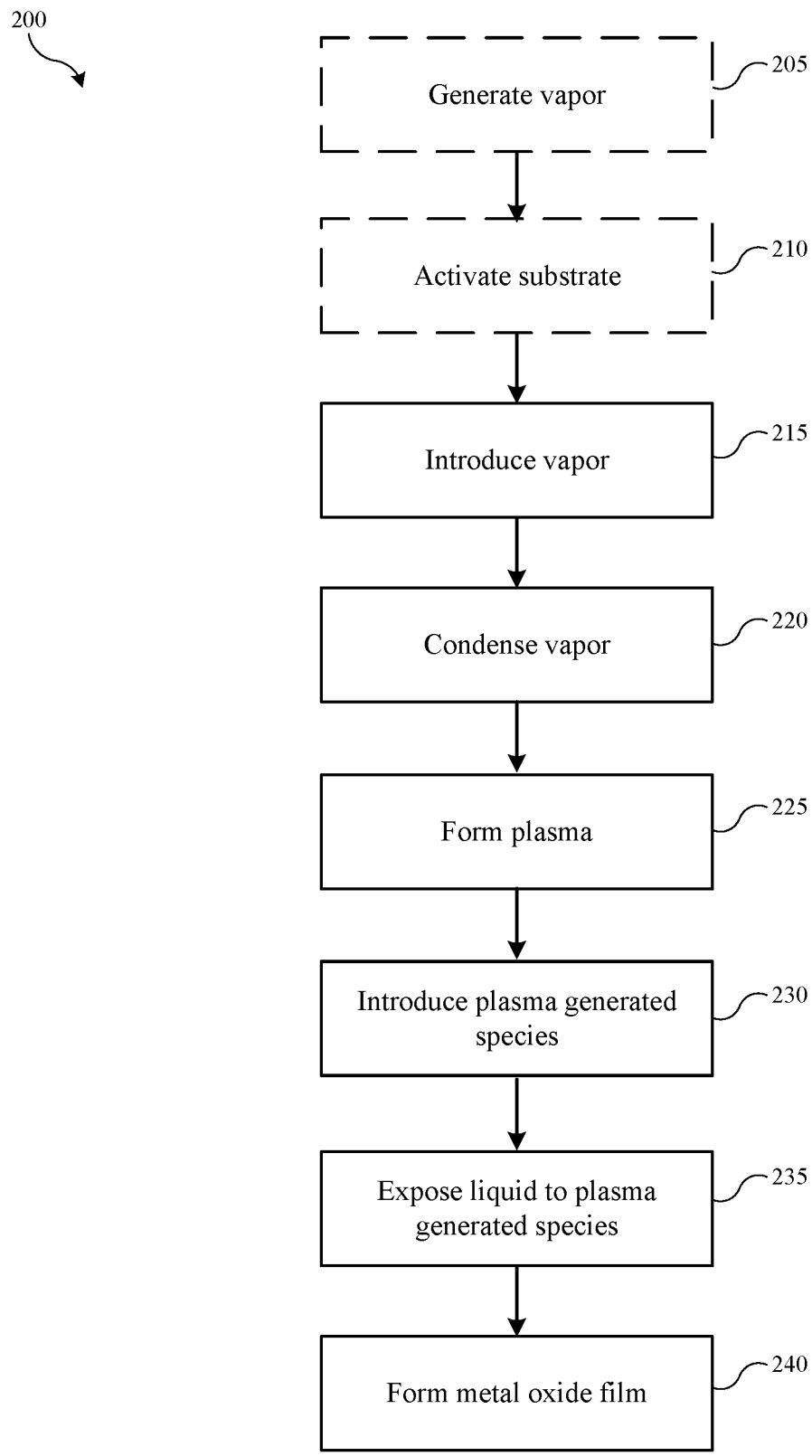
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Additional aspects of processing chamber 100 will be described further below. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing volume of a semiconductor processing chamber, such as processing chamber 100 described above, or other chambers that may include components as described above. The substrate may be deposited on a substrate support, which may be a pedestal such as substrate support 104, and which may reside in a processing volume of the chamber, such as processing volume 120 described above. Method 200 describes operations shown schematically in FIG. 3, the illustrations of which will be described in conjunction with the operations of method 200. It is to be understood that FIG. 3 illustrates only partial schematic views, and a processing system may include subsystems as illustrated in the figures, as well as alternative subsystems, of any size or configuration that may still benefit from aspects of the present technology.

Figure 3A:
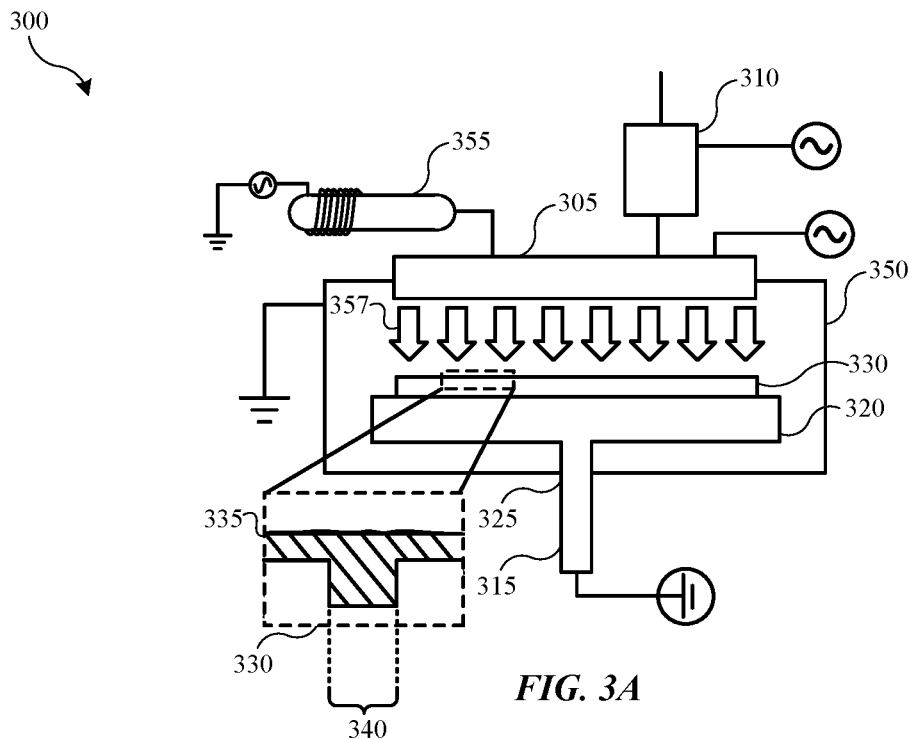
FIGS. 3A-3C show schematic views of an exemplary processing chamber during operations in a deposition method according to some embodiments of the present technology.
Figure 3B:
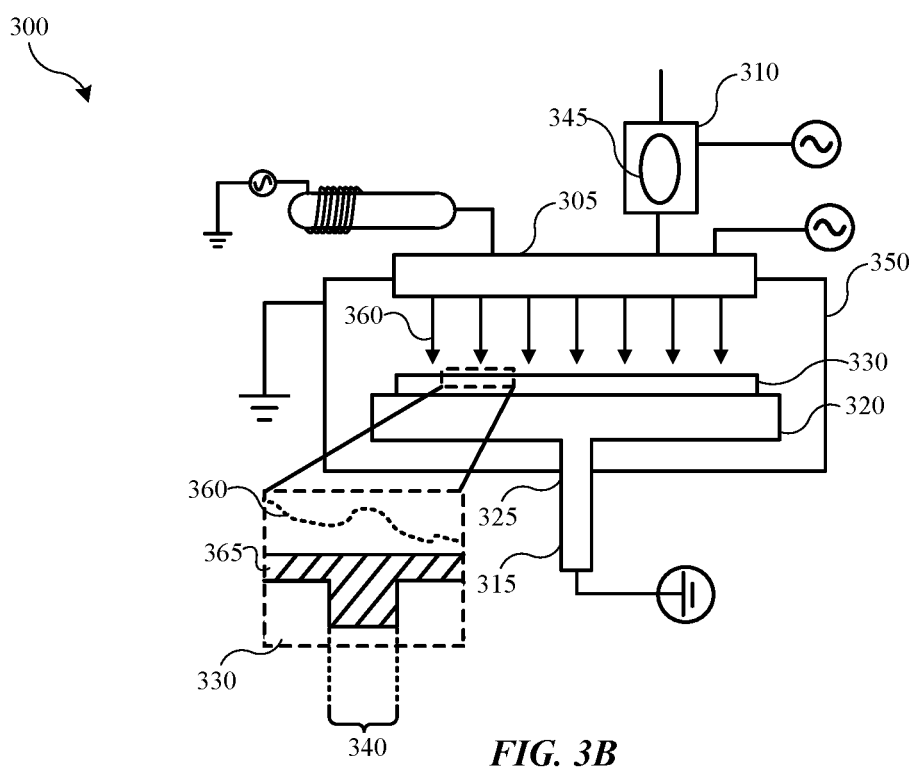
Figure 3C:
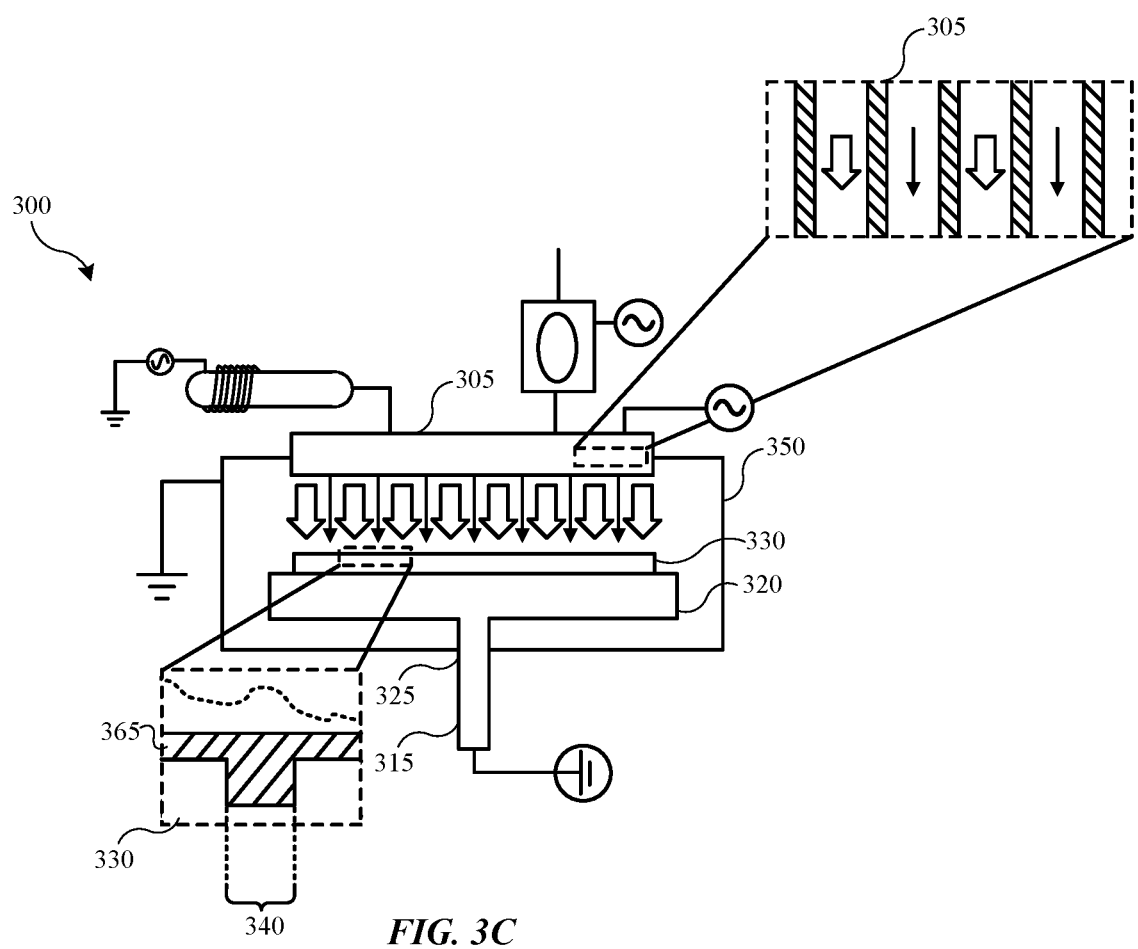

FIGS. 3A-3C show schematic views of an exemplary processing chamber during operations in a deposition method according to some embodiments of the present technology. FIGS. 3A-3C may illustrate further details relating to components in chamber 100, such as for substrate support 104, gas distributor 112, vapor source 154, and remote plasma source 158. System 300 is understood to include any feature or aspect of chamber 100 discussed previously in some embodiments. The system 300 may be used to perform semiconductor processing operations including FCVD operations as previously described, as well as other deposition, removal, and cleaning operations. System 300 may show a partial view of the chamber components being discussed and that may be incorporated in a semiconductor processing system, and may illustrate a view across a center of the pedestal and gas distributor, which may otherwise be of any size. Any aspect of system 300 may also be incorporated with other processing chambers or systems as will be readily understood by the skilled artisan.

System 300 may include a processing chamber including a showerhead 305, through which precursors may be delivered for processing, and which may be coupled with a remote plasma source 310 for generating a remote plasma external to a processing volume of the chamber. The showerhead 305 is shown at least partially internal to a processing chamber 350, and may be understood to be electrically isolated from the chamber 350, as described in reference to FIG. 1, such that the remote plasma source 310 may generate plasma generated species 360 and provide the plasma generated species 360 to the processing volume of the chamber 350 via the showerhead 305, to expose a substrate held on a pedestal or substrate support 315. The pedestal 315 may extend through the base of the chamber 350. The substrate support may include a support platen 320, which may hold a semiconductor substrate 330 during pre-treatment, deposition, or purge processes, as described in more detail in reference to FIG. 1 and FIG. 2. The support platen 320 may be coupled with a shaft 325, which may extend through the base of the chamber 350. In addition to embedded electrodes described in connection with the chamber 100, the support platen 320 may also include a thermal control system that may facilitate processing operations including, but not limited to, deposition, etching, annealing, or desorption. In particular, the thermal control system may provide the capability to maintain the support platen 320 below the phase transition temperature, such as the boiling point at a process pressure, of a vapor 357 of a metal oxide precursor, as part of FCVD operations of the system 300.

Through introduction of various precursor gases and control of plasma process conditions, the chamber may implement pre-treatment and deposition processes to form metal oxide films onto wafers held on the support platen 320, for example, by FCVD. Conventional PECVD, which may include forming a plasma in the processing volume, thereby exposing the substrate 330 directly to the plasma and flowing the precursor through the plasma directly. As a result, the precursor may form metal oxide particles and particle agglomerates in flight that may deposit as a conformal coating onto the substrate 330. In contrast to conventional PECVD, FCVD may include selectively condensing a precursor onto the substrate 330 as a liquid, such that the liquid precursor material 335 may flow into recessed features defined by the substrate including, but not limited to, a trench 340.

At operation 205, as illustrated in FIG. 3A, deposition procedures may optionally include generating a vapor 357 of a metal oxide precursor from a metal oxide precursor liquid. The metal oxide precursor may be or include a metal alkoxide, which may exhibit characteristic volatility at process pressures of the system 300 during FCVD operation. The metal alkoxide may be or include any metal alkoxide that may act as a precursor for deposition of metal oxide films or metal nitride films that may be incorporated into semiconductor structures, such as those formed during a CMOS process as part of gap-fill processes. For example, the metal alkoxide may be or include, aluminum iso propoxide, hafnium tert butoxide, or tin tert butoxide, which are only examples of three possible precursors.

As such, generating the vapor 357 of the metal oxide precursor may include vaporizing a liquid metal alkoxide held in an ampoule of a vapor source 355. The vapor source 355 may include, a heat source, a gas supply system, and control components, such that the liquid metal alkoxide held in the ampoule may be heated to a temperature at or about its boiling point at a process temperature, and may be entrained in a carrier gas flow. In an illustrative example, the heat source may be or include a resistive heating element configured such that the ampoule is placed in thermal communication with the heating element. By heating the ampoule, and the contents therein, the vapor 357 of the precursor may be provided to the gas supply system, which may permit the carrier gas flow to carry the vapor 357 of the precursor to the showerhead 305.

In some embodiments, method 200 may optionally include activating the surface of the substrate 330 at operation 210. Activating the substrate surface may include, but is not limited to, exposing the substrate 330 to a plasma formed between the showerhead 105 and the pedestal 315, as described in reference to FIG. 1, or by providing plasma generated species 360 from the remote plasma source 310, as described in more detail in reference to FIG. 3B and operation 225, below. The surface activation may provide tailored wettability of the substrate 330 to the liquid precursor, such that subsequent operations of method 200 may be improved.

In some embodiments, method 200 may include introducing the vapor 357 of the precursor to the chamber 350, at operation 215. Introducing the vapor 357 may include, as illustrated in FIG. 3A, flowing a carrier gas through the showerhead 305, which may include multiple channels, such as the apertures 118 of FIG. 1, sized and positioned such that the vapor 357 of the precursor is introduced with a controlled distribution into the processing volume of the chamber 350. For example, the carrier gas may be or include an inert gas, such as argon, helium, nitrogen, or other gas used for FCVD processes that may also be used to sustain a plasma. As illustrated, in some cases the carrier gas flow may be distributed uniformly across the surface of the substrate 330.

Subsequent introducing the vapor 357 of the precursor to the chamber 350, method 200 may include condensing the vapor 357 of the precursor onto the substrate 330, at operation 220. As described above, the support platen 320 may incorporate a thermal control system such that the substrate 330 may be maintained at a temperature below a boiling temperature of the precursor at the process pressure in the chamber 350. In this way, the vapor 357 of the precursor may condense onto the substrate 330 to form a liquid precursor 335 on the surface of the substrate 330. As part of operation 200, one or more components of the system 300 may be heated above the boiling temperature, which may reduce the extent to which the vapor 357 of the precursor condenses on unintended surfaces. For example, the showerhead 305, the chamber 350, the pedestal 315, or the shaft 325 may be heated above the boiling temperature of the precursor at the process pressure, while the support platen is maintained at a temperature below the boiling temperature. In some embodiments, each surface of the system 300 that may be exposed to the vapor 357 of the precursor may be heated, as where the boiling temperature is elevated relative to the equilibrium temperature of the exposed surfaces. For example, while the support platen 320 is described as being cool relative to the showerhead 305, the support platen 320 may actually be heated to a temperature lower than the temperature of the showerhead 305.

In some embodiments, the substrate 330 may define recessed structures, such as the trench 340. As illustrated in FIG. 3A, the liquid precursor 335 may substantially wet the surface of the substrate 330, such that the liquid precursor fills the trench 340. In this way, condensing the vapor 357 of the precursor onto the substrate 330 may permit subsequent operations of method 200 to form metal oxide films within the trench 340, rather than as a conformal layer bridging over the trench 340, which may constitute a significant improvement over conventional PECVD techniques at least in part by facilitating seam-free gap filling with metal oxide or metal nitride films. While FIG. 3A illustrates a single trench 340, this is intended merely to simplify explanation. In some embodiments, the substrate 330 may define multiple trenches, as well as other recessed features typical of semiconductor fabrication.

In some embodiments, the precursor may be or include aluminum iso propoxide, hafnium tert butoxide, or tin tert butoxide, each characterized by phase transition properties as summarized in the table, below:

| Process Pressure (Torr) | Boiling Temperature (° C.) | | |
|---|---|---|---|
| | Aluminum iso propoxide | Hafnium tert butoxide | Tin tert butoxide |
| 1 | 94.8 | 63.4 | 88.4 |
| 2 | 113.5 | 74.4 | 103.4 |
| 5 | 141.4 | 90.0 | 125.2 |
| 10 | 165.3 | 102.8 | 143.5 |
| 20 | 192.1 | 116.5 | 163.5 |
| 40 | 222.4 | 131.3 | 185.6 |

In this way, the temperature of the substrate 330 may be maintained below or about the boiling temperature for the precursor at a given process pressure, while the other surfaces of the chamber 350, the showerhead 305, and the pedestal 315 may be maintained above or about the boiling temperature of the precursor at the given process pressure. In this way, for any precursor exhibiting a boiling temperature within the range of temperatures achievable by the components of the system 300, the condensation of the vapor 357 of the precursor may be localized to the surface of the substrate 330 through maintaining the substrate 330 at a temperature below or about the boiling temperature of the precursor at the process pressure employed for method 200.

For example, the precursor may be or include hafnium tert butoxide and the process pressure may be at or about 5 torr. For this set of process conditions, the temperature of the exposed surfaces other than the substrate 330 and the support platen 320 may be greater than or equal to 80° C., greater than or equal to 90° C., greater than or equal to 100° C., greater than or equal to 110° C., or greater, depending on the process pressure and an extent to which the process pressure deviates from 5 torr. Accordingly, the temperature of the substrate 330 may be maintained less than or about 100° C., less than or about 90° C., less than or about 80° C., less than or about 70° C., less than or about 60° C., or less, depending on the process pressure and an extent to which the process pressure deviates from 5 torr.

As another example, the precursor may be or include aluminium iso propoxide and the process pressure may be at or about 1 torr. For this set of process conditions, the temperature of the exposed surfaces other than the substrate 330 and the support platen 320 may be greater than or equal to 70° C., greater than or equal to 80° C., greater than or equal to 90° C., greater than or equal to 100° C., greater than or equal to 110° C., or greater, depending on the process pressure and an extent to which the process pressure deviates from 1 torr. Accordingly, the temperature of the substrate 330 may be maintained less than or about 110° C., less than or about 100° C., less than or about 90° C., less than or about 80° C., less than or about 70° C., less than or about 60° C., or less, depending on the process pressure and an extent to which the process pressure deviates from 1 torr.

As another example, the precursor may be or include tin tert butoxide and the process pressure may be at or about 5 torr. For this set of process conditions, the temperature of the exposed surfaces other than the substrate 330 and the support platen 320 may be greater than or equal to 95° C., greater than or equal to 105° C., greater than or equal to 115° C., greater than or equal to 125° C., greater than or equal to 135° C., or greater, depending on the process pressure and an extent to which the process pressure deviates from 5 torr. Accordingly, the temperature of the substrate 330 may be maintained less than or about 140° C., less than or about 130° C., less than or about 120° C., less than or about 110° C., less than or about 100° C., less than or about 90° C., or less, depending on the process pressure and an extent to which the process pressure deviates from 5 torr.

The preceding examples are not intended to limit the possible process pressures, temperature operating points, or precursor selections for method 200 as implemented in the system 300. Instead, the preceding examples are included to illustrate possible configurations that may be implemented to effect localized condensation onto the substrate 330 of the vapor 357 of the precursor, by maintaining the substrate 330 at a temperature lower than the boiling temperature of the precursor at the process pressure. Other possible configurations may be contemplated, based, for example, on the data included in the table above, while other configurations may also be possible, derived from thermodynamic data for metal alkoxides or other materials that may be implemented as precursors in FCVD processes of method 200.

Subsequent condensing the vapor 357 onto the substrate 330, method 200 may include forming a plasma 345 at operation 225. As illustrated in FIG. 3B, In some embodiments, the plasma 345 may be formed by the remote plasma source 310 external to the processing volume of the chamber 350. The plasma 345 may be formed of a mixture of inert and oxygen-containing gases, such as argon, helium, or nitrogen with oxygen containing species, such that the composition of the plasma includes a relatively high species density of oxygen radicals. Being relatively longer lived than other more energetic or reactive plasma generated species 360, such as ions and free electrons that may recombine on exposed surfaces, radicals or metastable species may be suitable for remote generation and entrainment in a carrier gas.

In some embodiments, the plasma gas may be selected to produce plasma generated species 360 that will react with the liquid precursor 335 to form a metal oxide film or a metal nitride film. For example, plasma generated species 360 may be or include plasma activated diatomic oxygen, diatomic nitrogen, or diatomic hydrogen. As another example, plasma generated species 360 may be or include monatomic oxygen radicals, monatomic nitrogen radicals, or monatomic hydrogen radicals.

Subsequent forming the plasma, plasma generated species 360 may be introduced into the process volume of the chamber 350, at operation 230. The plasma generated species 360 may be introduced into the process volume of the chamber 350 via the showerhead 305, as indicated by arrows in FIG. 3B. In some embodiments, the showerhead 305 may incorporate multiple channels for distributing the plasma generated species 360 across the surface of the substrate 330. The channels for distributing the plasma generated species 360 may be of various sizes and may be positioned in the showerhead 305 to produce a given flow pattern across the surface of the substrate 330. In some embodiments, the showerhead 305 may incorporate two sets of mutually-isolated channels and two isolated gas distributors, such that the vapor 357 of the precursor and the plasma generated species 360 may be introduced to the processing volume of the chamber 350 without reacting or forming a film on the interior surfaces of the showerhead 305.

Subsequent introducing the plasma generated species 360 into the chamber 350, method 200 may include exposing the liquid precursor 335 to plasma generated species 360 on the surface of the substrate 330. While method 200 as illustrated in FIG. 2 describes operations in a particular order, different order or timing may be implemented as part FCVD processes of method 200. For example, as illustrated in FIG. 3C, operations 215 and 230 may be implemented substantially concurrently, such that the liquid precursor is exposed to plasma generated species 360 while condensation is still occurring. In this way, plasma generated species 360 may be exposed to the liquid precursor with reduced mass transfer limitations that may impair the formation of uniform films within one or more trenches 340 defined by the substrate 330. For example, the plasma generated species 360 may be dosed intermittently with the vapor 357 of the precursor into the chamber 350. In this way, exposure at operation 235 may be controlled both in terms of time and radical density, which may influence reaction parameters including, but not limited to, reaction rate or physical properties of the film. As another example, the plasma generated species 360 may be dosed into the processing volume while the vapor 357 of the precursor is introduced continuously. In this way, the liquid precursor can condense onto the surface of the substrate 330 while the liquid 335 is exposed to a measured dose of plasma generated species 360. As illustrated in FIG. 3C, the showerhead 305 may include multiple mutually-isolated channels for introducing the vapor 357 of the precursor and the plasma generated species 360 into the chamber 350, without exposure prior to condensation. In this way, by dosing the plasma generated species 360, vapor 357 of the precursor may be removed from the chamber by gas exchange before dosing the plasma generated species 360 in multiple iterations of method 200. Alternatively, the liquid precursor 335 may be exposed to plasma generated species 360 introduced while the vapor 357 of the precursor is being introduced through the showerhead 305, without substantial exposure external to the processing volume of the chamber 350.

Subsequent exposure of the liquid precursor 335 to the plasma generated species 360, method 200 may include forming a metal oxide film 365 within the trench 340, at operation 240. As illustrated in FIGS. 3B and 3C, the deposition process may form the metal oxide film 365 on the substrate 330 and within the trench 340. Forming the metal oxide film may include, but is not limited to radical mediated ligand removal. For example, the liquid precursor 335 may be or include aluminum iso propoxide, where the molecular structure of the liquid precursor 335 may include multiple organic moieties, namely, propoxides. In this example, plasma generated species 360 may remove the multiple propoxide moieties from the precursor molecule and form a matrix from the remaining metal oxide, thereby producing the metal oxide film 365 and a gaseous organic byproduct that may be desorbed from the surface and removed by gas exchange. As described in reference to operation 235, forming the metal oxide film may include multiple repeated iterations, facilitating an incremental deposition of the metal oxide film 365 filling the trench 340. In some cases, the metal oxide film 365 may be formed continuously, or by condensing the liquid precursor 335 continuously while intermittently dosing the plasma generated species 360.

By utilizing methods and components according to embodiments of the present technology, material deposition or formation may be improved. By providing metal oxide or metal nitride films within or filling recessed features by FCVD, semiconductor fabrication processes may incorporate oxide structures at increasingly small feature sizes. These improvements may include reduced film bridging over recessed features defined on a substrate, and may improve semiconductor yield on a wafer scale. Additionally, material waste may be reduced by controlling deposition of film precursor material through localized condensation, as opposed to other techniques that may deposit precursor on all exposed surfaces. Additionally, process uniformity may be improved by incorporating gas distribution structures that isolate a vapor 357 of a precursor from plasma generated species 360 prior to exposure localized to a surface of a substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
introducing a vapor of a metal alkoxide into a processing volume of a semiconductor processing chamber, wherein a substrate defining a trench is housed in the processing volume;
condensing the vapor into a liquid metal alkoxide within the trench on the substrate;
forming a plasma external to the processing volume of the semiconductor processing chamber;
introducing plasma-generated species into the processing volume;

exposing the liquid metal alkoxide in the trench to the plasma-generated species; and forming a metal oxide film in the trench through a reaction between the liquid metal alkoxide and the plasma-generated species.

2. The deposition method of claim 1, further comprising: generating the vapor of the metal alkoxide by heating an ampoule of a liquid comprising the metal alkoxide above a boiling point of the metal alkoxide at a process pressure.

3. The deposition method of claim 1, wherein:
the semiconductor processing chamber comprises a pedestal;
the semiconductor processing chamber is maintained at a process pressure;
the semiconductor processing chamber is maintained at a first temperature equal to or greater than a boiling point of the metal alkoxide at the process pressure; and
the pedestal is individually maintained at a second temperature less than the boiling point of the metal alkoxide at the process pressure.

4. The deposition method of claim 3, wherein the vapor of the metal alkoxide comprises hafnium tert butoxide, the process pressure is at or about 1 torr, the first temperature is greater than or equal to 50° C., and the second temperature is less than or about 70° C.

5. The deposition method of claim 3, wherein the vapor of the metal alkoxide comprises tin tert butoxide, the process pressure is at or about 1 torr, the first temperature is greater than or about 80° C., and the second temperature is less than or about 90° C.

6. The deposition method of claim 3, wherein the vapor of the metal alkoxide comprises aluminium iso propoxide, the process pressure is at or about 1 torr, the first temperature is greater than or about 90° C., and the second temperature is less than or about 100° C.

7. The deposition method of claim 6, wherein the plasma generated species comprise monatomic oxygen radicals, and wherein introducing the plasma generates species into the processing volume comprises providing the monatomic oxygen radicals to the trench.

8. The deposition method of claim 7, wherein the reaction comprises radical-mediated removal of organic moieties of the metal alkoxide.

9. A deposition method comprising:
forming a plasma external to a processing volume of a semiconductor processing chamber, wherein a substrate defining a trench is housed in the processing volume;
introducing plasma-generated species into the processing volume;
introducing a vapor of a metal alkoxide into the processing volume concurrently with the introduction of the plasma-generated species;
generating metal oxide reaction products through a reaction between the vapor of the metal alkoxide and the plasma-generated species;
condensing the metal oxide reaction products from a vapor to a liquid onto the substrate; and
forming a metal oxide film in the trench, the metal oxide film comprising the metal oxide reaction products.

10. The deposition method of claim 9, further comprising: generating the vapor of the metal alkoxide by heating an ampoule of a liquid comprising the metal alkoxide above a boiling point of the metal alkoxide at a process pressure.

11. The deposition method of claim 9, wherein:
the semiconductor processing chamber comprises a pedestal;
the semiconductor processing chamber is maintained at a process pressure;
the semiconductor processing chamber is maintained at a first temperature equal to or greater than a boiling point of the metal alkoxide at the process pressure; and
the pedestal is individually maintained at a second temperature less than the boiling point of the metal alkoxide at the process pressure.

12. The deposition method of claim 11, wherein the vapor of the metal alkoxide comprises hafnium tert butoxide, the process pressure is at or about 5 torr, the first temperature is greater than or about to 80° C., and the second temperature is less than or about 100° C.

13. The deposition method of claim 11, wherein the vapor of the metal alkoxide comprises tin tert butoxide, the process pressure is at or about 5 torr, the first temperature is greater than or equal to 115° C., and the second temperature is less than or about 130° C.

14. The deposition method of claim 11, wherein the vapor of the metal alkoxide comprises aluminium iso propoxide, the process pressure is at or about 1 torr, the first temperature is greater than or equal to 130° C., and the second temperature is less than or about 150° C.

15. The deposition method of claim 9, wherein the metal oxide film fills the trench.

16. A deposition method comprising:
evaporating a metal alkoxide liquid from an ampoule at a first temperature and a process pressure, wherein the evaporation generates a vapor of the metal alkoxide from the metal alkoxide liquid;
introducing the vapor of the metal alkoxide into a semiconductor processing chamber via a first plurality of channels of a dual-source gas distributor;
forming a plasma external to a processing volume of the semiconductor processing chamber, wherein a substrate defining a trench is housed in the processing volume;
introducing plasma-generated radicals into the processing volume via a second plurality of channels of the dual-source gas distributor, wherein the first plurality of channels is isolated from the second plurality of channels;
condensing the vapor of the metal alkoxide onto the substrate, wherein the condensing forms a liquid metal alkoxide within the trench;
exposing the liquid metal alkoxide within the trench to the plasma-generated radicals; and
forming a metal oxide film within the trench through a reaction with the plasma-generated radicals.

17. The deposition method of claim 16, wherein introducing the plasma-generated radicals follows the condensing the vapor of the metal alkoxide onto the substrate.

18. The deposition method of claim 16, wherein the plasma-generated radicals comprise at least one of monatomic oxygen radicals or monatomic hydrogen radicals.

19. The deposition method of claim 16, wherein the plasma is formed from a gas comprising hydrogen and oxygen.

20. The deposition method of claim 19, wherein the metal alkoxide liquid comprises at least one of aluminium iso propoxide, tin tert butoxide, or hafnium tert butoxide.

* * * * *